United States Patent

[11] 3,633,120

[72] Inventor Carl R. Battjes
Portland, Oreg.

[21] Appl. No. 72,661
[22] Filed Sept. 16, 1970
[45] Patented Jan. 4, 1972
[73] Assignee Tektronix, Inc.
Beaverton, Oreg.

[54] AMPLIFIER CIRCUIT
8 Claims, 1 Drawing Fig.

[52] U.S. Cl. .......... 330/30 R, 330/20
[51] Int. Cl. .......... H03f 3/68
[50] Field of Search .......... 330/30 R, 20

[56] References Cited
UNITED STATES PATENTS
3,254,302 5/1966 Boykia et al. .......... 330/30 X

*Primary Examiner*—Nathan Kaufman
*Attorney*—Buckhorn, Blore, Klarquist & Sparkman

ABSTRACT: An amplifier circuit for increasing current gain at high frequencies includes first and second pairs of transistors, wherein the outputs of the transistor pairs are coupled in parallel while a common input current is provided in series to the four transistors. The circuit substantially doubles the current gain achieved at certain high frequencies.

PATENTED JAN 4 1972
3,633,120
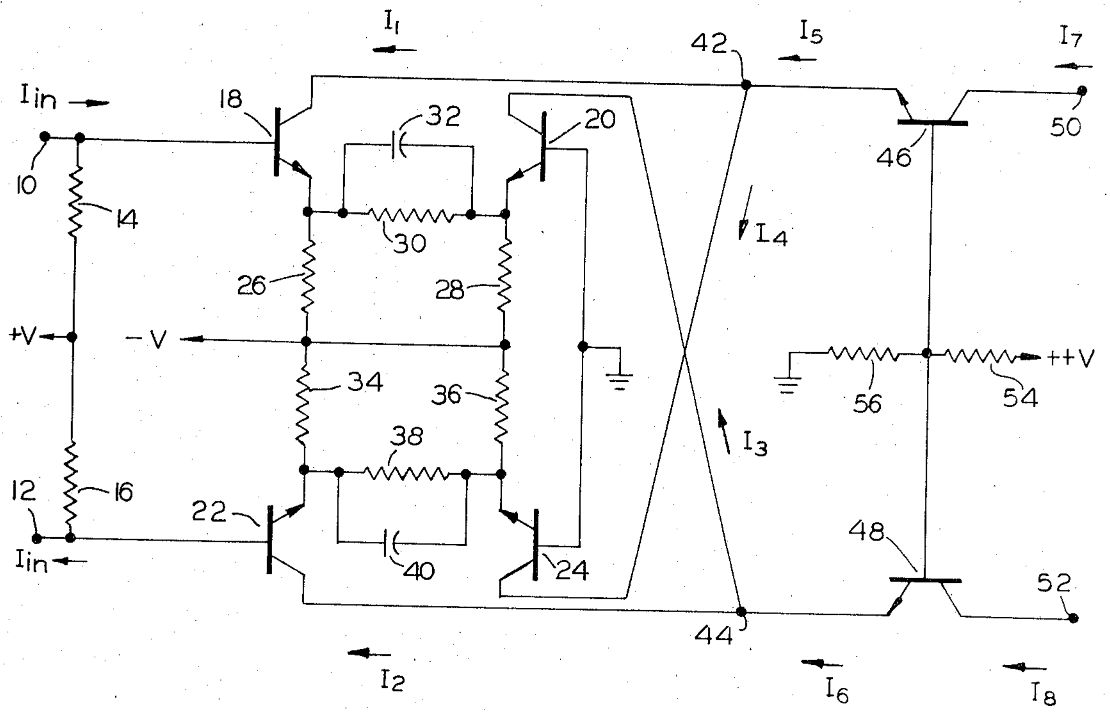
CARL R. BATTJES
INVENTOR
BY
BUCKHORN, BLORE, KLARQUIST & SPARKMAN
ATTORNEYS

AMPLIFIER CIRCUIT

BACKGROUND OF THE INVENTION

Transistor amplifiers exhibiting a certain current gain at low frequencies will eventually exhibit a rolloff, usually 6 db. per octave, as a function of frequency. As the frequency is increased, the gain will decrease to unity and to fractional values. Thus, the designation $f_T$ is employed to indicate the frequency at which the short circuit current gain of a common emitter-connected transistor amplifier is equal to one. Cascading the transistors does not provide additional gain at and above $f_T$ because cascading stages, each with unity or less than unity gain, will obviously provide no higher gain.

SUMMARY OF THE INVENTION

According to the present invention, the $f_T$ characteristic of a common emitter-connected transistor amplifier is doubled, or alternatively, the gain at the usual $f_T$ value is doubled. Consequently, the frequency is increased at which practical amplifier operation is achievable.

According to the circuit of the present invention, first and second pairs of common emitter-coupled transistors have their collector outputs paralleled in an in-phase, current aiding sense. The transistor inputs are serially coupled to receive a common input current.

In a preferred embodiment of the present invention, a first resistor couples the emitter terminals of the first pair of transistors while a second resistor couples the emitter terminals of the second pair of transistors. An input current is supplied between a base terminal of the first pair and a base terminal of the second pair. The remaining base terminals are coupled together to complete an input series current path. Each pair of transistors provides an output current in response to the input current, but since the transistor pair outputs are paralleled, the current is increased by two. Also, in a preferred embodiment, the resulting paralleled output currents are connected to a push-pull, common base-connected transistor amplifier for maximizing the current gain of the first-mentioned pairs of transistors.

It is accordingly an object of the present invention to provide an amplifier with improved current gain.

It is another object of the present invention to provide an amplifier exhibiting improved current gain at high frequencies.

It is a further object of the present invention to provide an improved amplifier characterized by a higher frequency at which the current gain reduces to unity.

It is a further object of the present invention to provide an improved amplifier having enhanced current gain at high frequencies wherein the proper phase balance is maintained.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawing wherein like reference characters refer to like elements.

DRAWING

The single FIGURE of drawing is a schematic diagram of the amplifier according to the present invention.

DETAILED DESCRIPTION

Referring to the drawing, the amplifier according to the present invention is provided with a pair of current input terminals 10 and 12 to which and from which an input current $I_{in}$ is coupled. A first resistor 14 returns terminal 10 to a source of reference potential, e.g., a low positive voltage, while resistor 16 similarly returns terminal 12 to the same source of reference potential. Terminal 10 is connected to the base of NPN-transistor 18 which forms, together with NPN-transistor 20, a first transistor pair according to the present invention. Input terminal 12 is connected to the base of NPN-transistor 22 which forms, in combination with NPN-transistor 24, a second transistor pair according to the present invention. The base terminals of transistors 20 and 24 are coupled together and are suitably also returned to a point of common reference potential, i.e., ground.

The emitter terminals of transistors 18 and 20 are coupled by means of a resistor 30, shunted by capacitor 22 for enhancing high-frequency performance. A transistor 26 returns the emitter of transistor 18 to a negative supply voltage while resistor 28 similarly returns the emitter of transistor 20 to the negative supply voltage. A resistor 38 is employed to couple the emitter of transistor 22 to the emitter of transistor 24, with a capacitor 40 being shunted across resistor 38 to enhance coupling of high frequencies. Resistors 34 and 36 respectively return the emitters of transistors 22 and 24 to the negative supply voltage.

The collectors of the transistor pairs are connected to output terminals 42 and 44. Thus, the collectors of transistors 18 and 24 are connected in common to terminal 42, while the collectors of transistors 20 and 22 are connected in common to terminal 44.

A push-pull, common base-connected amplifier comprising NPN-transistors 46 and 48 is coupled to the aforementioned output terminals 42 and 44, for developing a further output between terminals 50 and 52. A source of current supply will be coupled between terminals 50 and 52. The emitter of transistor 46 is connected to terminal 42 while its collector connects to terminal 50. Similarly, the emitter of transistor 48 is connected to output terminal 44, and the collector of the transistor 48 is connected to terminal 52. The bases of transistors 46 and 48 are connected in common to the midpoint of a voltage divider comprising resistors 54 and 56 disposed in that order between a positive voltage and ground, this voltage divider providing the proper bias voltage for transistors 46 and 48. The push-pull amplifier comprising transistors 46 and 48 provides a low-impedance load at terminals 42 and 44 for maximizing the current gain of the circuit comprising transistors 18, 20, 22, and 24. Thus, nearly the full maximum short circuit gain of the last-mentioned transistors can be realized.

Considering operation of the FIG. 1 circuit, a substantial proportion of the input current, $I_{in}$ flows across the base-emitter junctions of transistors 18, 20, 24, and 22 connected in series, with the remainder flowing in resistors 14 and 16. Normally, the resistance values of resistors 26 and 28 are equal and are much larger than the resistance value of resistor 30. Similarly, the resistance values of resistors 34 and 36 are suitably equal to each other and to the values of resistors 26 and 28. Resistor 38 suitably has the same value of resistance as the aforementioned resistor 30. It follows that an incremental current signal in the emitter of transistor 18 is approximately equal to the incremental current signal in the emitter of transistor 20 and in resistor 30 therebetween. Furthermore, the same incremental signal is present in the emitters of transistors 22 and 24 as well as resistor 38 therebetween. Each pair of transistors, i.e. pair 18,20 or pair 22,24, functions as a push-pull stage providing incremental output currents related to the input current by the gain of the stage. For instance, considering incremental currents in each case, $I_1$ flowing in the collector of transistor 18 approximately equals $I_{in}R_o/R_1$ at low frequencies, where $R_o$ equals the resistance of resistors 14 and 16, and $R_1$ equals the resistance of resistors 30 and 38. At low frequencies the gain of stage 18,20 is dependent upon the value of resistor 30 because of the appreciable emitter feedback provided by resistor 30. The behavior of transistor 18, for example, is very close to that which would occur if the right-hand side of resistor 30 were grounded. Moreover, inasmuch as the same input is applied to transistor 20, $I_3$ also approximately equals $I_{in}R_o/R_1$. The output currents $I_1$ and $I_3$ are equal, but 180° out of phase, since transistors 18 and 20 form a push-pull configuration.

Similarly, the collector current $I_2$ from transistor 22 approximately equals $I_{in}R_o/R_1$, while $I_4$, the collector current from transistor 24, equals the same value but is 180° out of phase therewith. By crossing over the push-pull amplifier output leads as shown, the output currents are added in phase. Thus, incremental currents $I_1$ and $I_4$, flowing in a first direction at a given time, are combined at terminal 42 to provide current $I_5$. Incremental currents $I_2$ and $I_3$, flowing in a second direction at such time, are combined at terminal 44 to provide a common current $I_6$. Currents $I_5$ and $I_6$ are each double the output current provided by one transistor pair alone.

Thus, the output currents are added in phase to provide a double output current. Even at the frequency $f_T$, at which the current gain of a common emitter-connected transistor is equal to one, the present circuit will produce a gain of two. Under the normal assumption that current gain at high frequencies is inversely proportional to frequency, then the gain at $2f_T$ equals one since the gain of the circuit at $f_T$ is two. Consequently, the circuit is operative in a practical sense at higher frequencies than circuits heretofore employed.

Let us assume for the moment a first circuit according to the present invention, and a second or conventional circuit, each having the same gain at low frequencies. Further assume the second circuit is similar to one of the above-described push-pull pairs, such as stage 18,20. To provide a current gain of say, four, at low frequencies, the second circuit would have to have a resistance ratio $R_o/R_1$ equaling four, while the present circuit would only have a ratio $R_o/R_1$ equaling two, because of the current-doubling effect. The break frequency for an amplifier or the frequency at which rolloff starts, e.g., the frequency at which the output signal is 3 db. down, may be considered to equal $f_T/(R_o/R_1)$. For the second amplifier mentioned above, the ratio $R_o/R_1$ equals four for a gain of four, but the circuit according to the present invention has half the resistance ratio to produce the same gain at low frequencies. Since the resistance ratio is half as much, the break frequency is twice the break frequency for the conventional circuit.

As another advantage of the present circuit, the required dynamic current swing of each transistor pair is half of what would be the requirement if only one transistor were employed. Furthermore, the employment of the double push-pull, parallel output circuit provides proper phase balance throughout the circuit. Thus, since the circuit is balanced, distortion-causing phase differentials will not be present between the input and portions of the output circuit.

As hereinbefore stated, the push-pull amplifier comprising transistors 46 and 48 provides a low-impedance load at output terminals 42 and 44. The incremental output current $I_7$, at terminal 50, is nevertheless substantially equal to incremental current $I_5$. Also, the incremental output $I_8$ at terminal 52 substantially equals incremental current $I_6$.

The concept of applying input current in series and deriving output current in parallel can be extended to provide current multiplication in excess of two. For instance, the output current can be quadrupled, etc. Thus, instead of supplying input current in series to only one pair of transistors 18 and 20, between terminal 10 and ground, yet another similarly connected pair may be added in series therewith, i.e., with base terminals connected between the base of transistor 20 and ground. The collector outputs of such additional pair would then be connected in a phase additive sense at terminals 42 and 44. Another additional transistor pair would be similarly interposed between the base of transistor 24 and ground with a resultant quadrupling of the output current, or further extension of the operating frequency for a selected gain. Circuits for providing further multiplication will not be separately illustrated because of substantial duplication of the illustrated circuit.

While I have shown and described a preferred embodiment of my invention, it will be apparent to those skilled in the art that many changes and modifications may be made without departing from my invention in its broader aspects. I therefore intend the appended claims to cover all such changes and modifications as fall within the true spirit and scope of my invention.

I claim:

1. An amplifier circuit for producing enhanced current gain at high frequencies, said amplifier comprising:
   - first and second output terminals,
   - a first pair of transistors provided with means coupling their emitters together and having their collectors coupled respectively to said first and second output terminals,
   - a second pair of transistors provided with means coupling their emitters together and having their collectors also coupled to said first and second output terminals to provide an in-phase current output in parallel with the current output of the first pair of transistors,
   - and means for providing a common series input current to the four transistors.

2. The apparatus according to claim 1 wherein said means for providing a common series input current comprises first and second input terminals, means coupling a first input terminal to the base terminal of one of said first pair of transistors, means coupling the second input terminal to the base terminal of one of said second pair of transistors, and means coupling the remaining base terminal of the first pair to the remaining base terminal of the second pair forming a common serial input current connection.

3. The apparatus according to claim 2 wherein said means coupling said emitters of the first pair of transistors and the means coupling the emitters of the second pair of transistors each comprises a resistor.

4. The apparatus according to claim 3 further including a capacitor shunted across each of said resistors for enhancing emitter coupling at high frequencies.

5. The apparatus according to claim 1 further including a pair of push-pull, common base-connected transistors wherein an emitter of each of said last-mentioned transistors is coupled to one of said output terminals to provide a low-impedance load therefor, the output current of the apparatus being provided between collector terminals of the last-mentioned transistors.

6. An amplifier circuit for producing enhanced current gain at high frequencies, said amplifier comprising:
   - first and second transistors having their emitters coupled,
   - third and fourth transistors also having their emitters coupled,
   - means coupling the collectors of said first and fourth transistors together and means coupling the collectors of the second and third transistors together,
   - and means for providing a common series input current to the four transistors wherein said input current passes from base terminal to emitter terminal in a first direction in said first and third transistors, and in a second direction in said second and fourth transistors.

7. The apparatus according to claim 6 wherein the emitters of said first and second transistors are coupled together by means of a first resistor, and wherein the emitters of said third and fourth transistors are coupled together by means of a second resistor, said apparatus further including resistors having a higher resistance value returning the base terminals of said first and third transistors to a first point of reference potential while the base terminals of the second and fourth transistors are coupled together.

8. The apparatus according to claim 6 further including a pair of push-pull, common base-connected transistors wherein an emitter of one of said common base-connected transistors is coupled to the collector terminals of said first and fourth transistors, while the emitter terminal of the second of said pair of common base-connected transistors is connected to the collector terminals of the second and third transistors, the output current of the apparatus being provided between the collector terminals of the common base-connected transistors.

* * * * *